United States Patent [19]

Takakura et al.

[11] Patent Number: 5,181,034
[45] Date of Patent: Jan. 19, 1993

[54] DIGITAL TO ANALOG CONVERTER

[75] Inventors: Hiroshi Takakura, Kawasaki; Akira Yamaguchi; Tetsuya Iida, both of Yokohama, all of Japan

[73] Assignee: Kabushiki Kaishi Toshiba, Kanagawa, Japan

[21] Appl. No.: 875,646

[22] Filed: Apr. 29, 1992

[51] Int. Cl.⁵ .................. H03M 1/66; H03M 1/76
[52] U.S. Cl. .................. 341/144; 341/145; 341/148
[58] Field of Search ............ 341/144, 145, 154, 159, 341/148

[56] References Cited

U.S. PATENT DOCUMENTS

| | | | |
|---|---|---|---|
| 4,352,092 | 9/1982 | Masuda et al. | 341/148 X |
| 4,873,525 | 10/1989 | Iida | 341/145 |
| 4,875,046 | 10/1989 | Lewyn | 341/148 |
| 4,973,979 | 11/1990 | Ikeda | 341/145 X |

OTHER PUBLICATIONS

T. Miki et al., "An 80-MHz 8-bit CMOS D/A Converter", *IEEE J. Solid-State Circuits*, vol. SC-21, No. 6., pp. 983-988, Dec. 6, 1988.
H. Takakura et al., "A 10 bit 80 MHz Glitchless CMOS D/A Converter", *CICC Digest Technical Papers*, pp. 26.5.1-26.5.4, 1991.

*Primary Examiner*—Sharon D. Logan
*Attorney, Agent, or Firm*—Banner, Birch, McKie & Beckett

[57] ABSTRACT

Signal sources are arranged in a matrix form and provide preset analog values. Switching means are connected between signal sources and an analog output terminal having connection paths to the respective signal sources. Latch circuits are respectively provided for switch control circuits for controlling the switching means. Each of the latch circuits latches a control signal from a corresponding one of the switch control circuits and outputs the control signal in response to a preset synchronizing signal to a corresponding one of the switching means. The switching means are simultaneously controlled by output signals of decoders so that a desired analog output is permitted to be derived from the output terminal. The period of the clock signal can be shorten and a switching operation causing variation exceeding a desired variation occurring when the digital signal is changed can be prevented.

10 Claims, 17 Drawing Sheets

| D1 | D0 | PY1 | PY2 | PY3 |
|----|----|-----|-----|-----|
| D3 | D2 | PX1 | PX2 | PX3 |
| 1  | 1  | 0   | 0   | 0   |
| 1  | 0  | 1   | 0   | 0   |
| 0  | 1  | 1   | 1   | 0   |
| 0  | 0  | 1   | 1   | 1   |

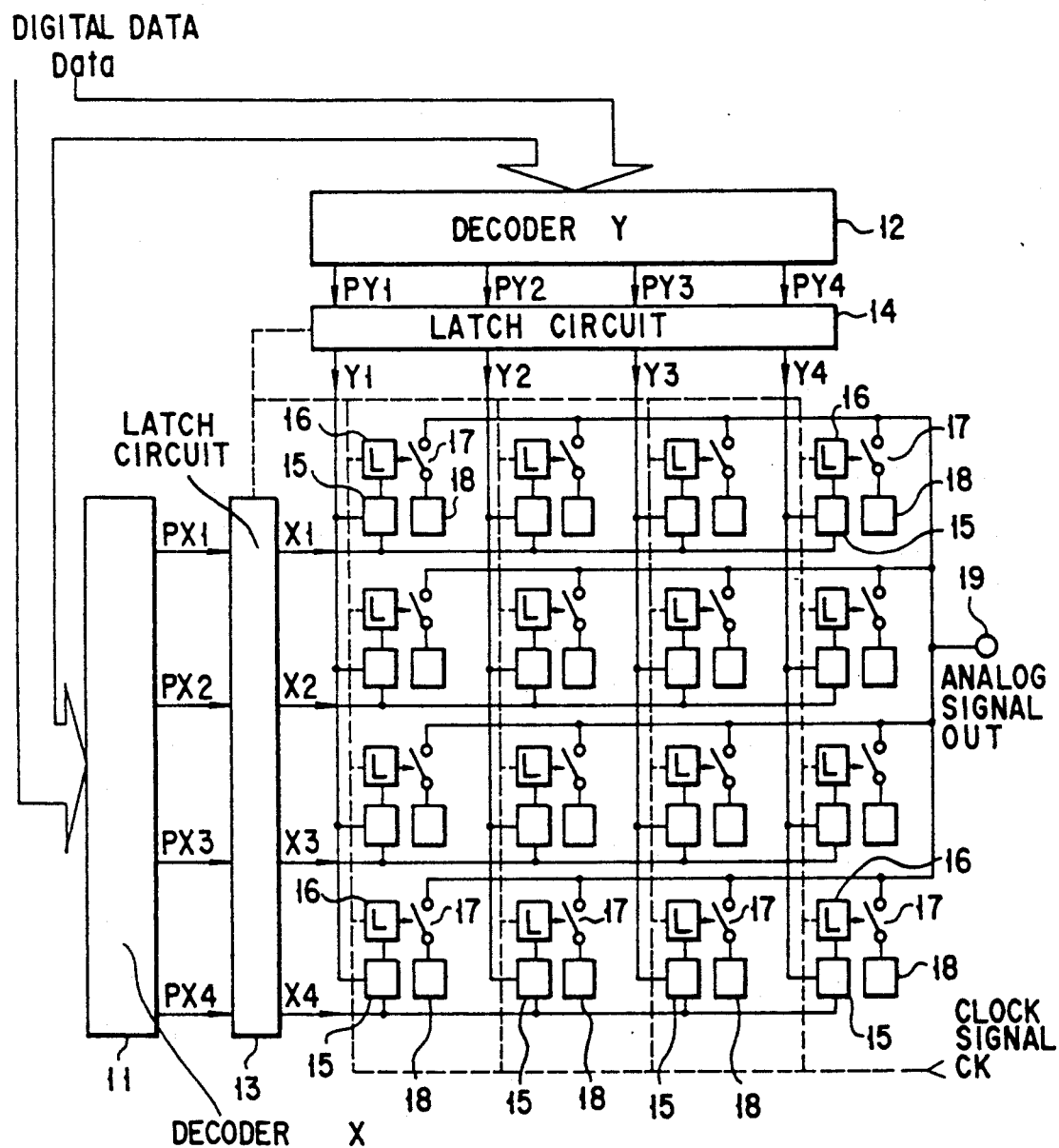
F I G. 12

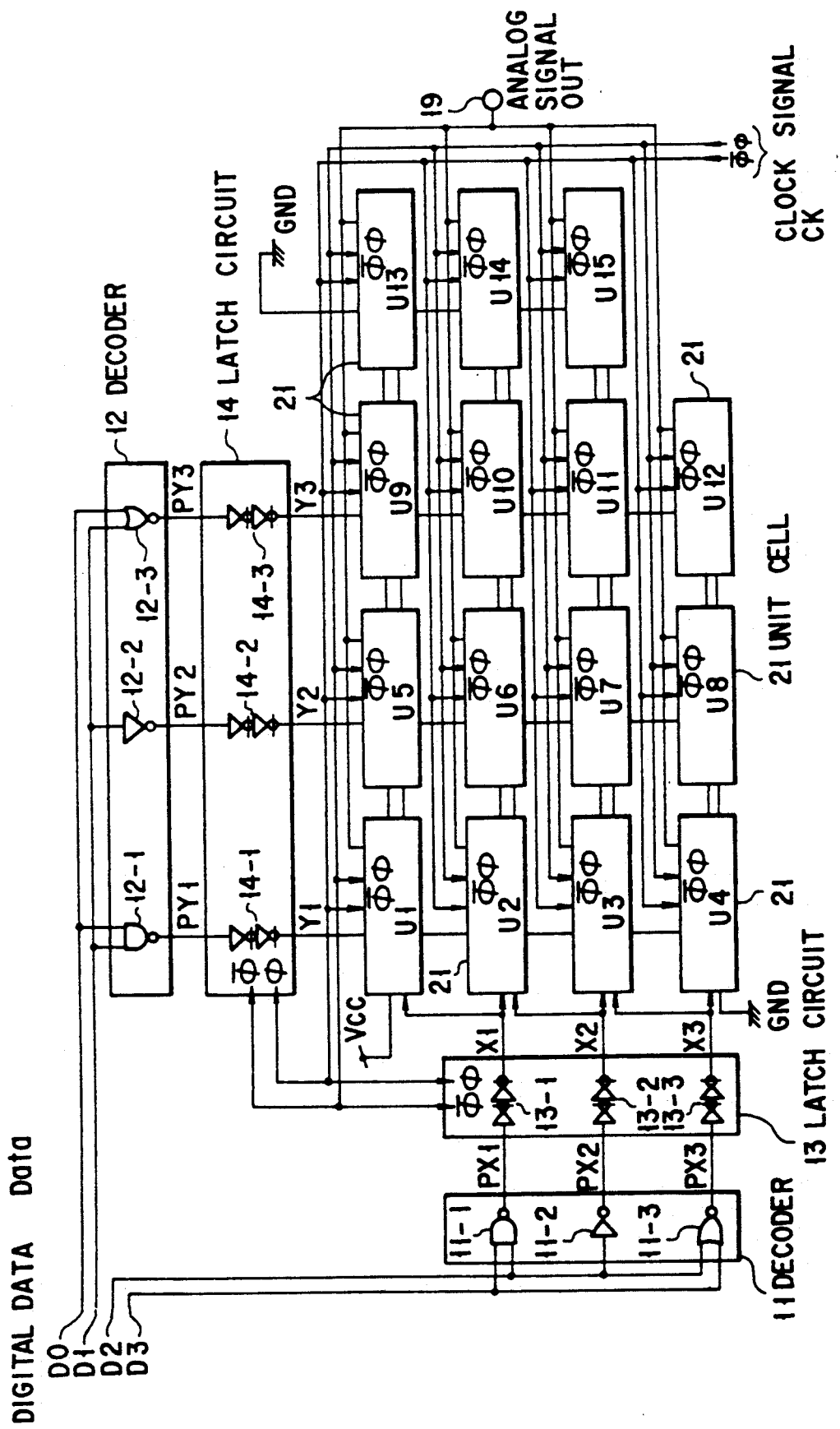
F I G. 15

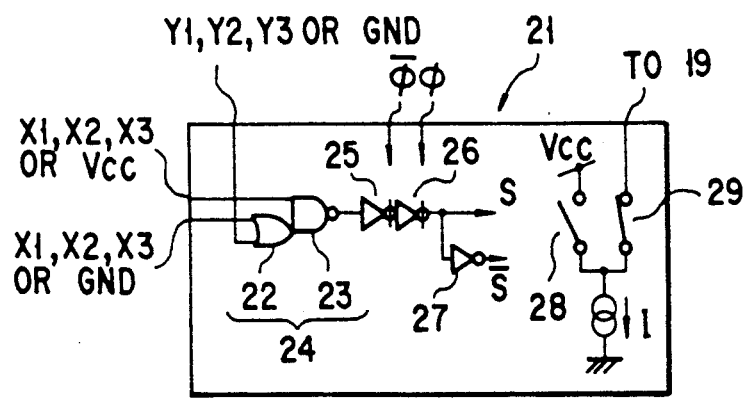
FIG. 16
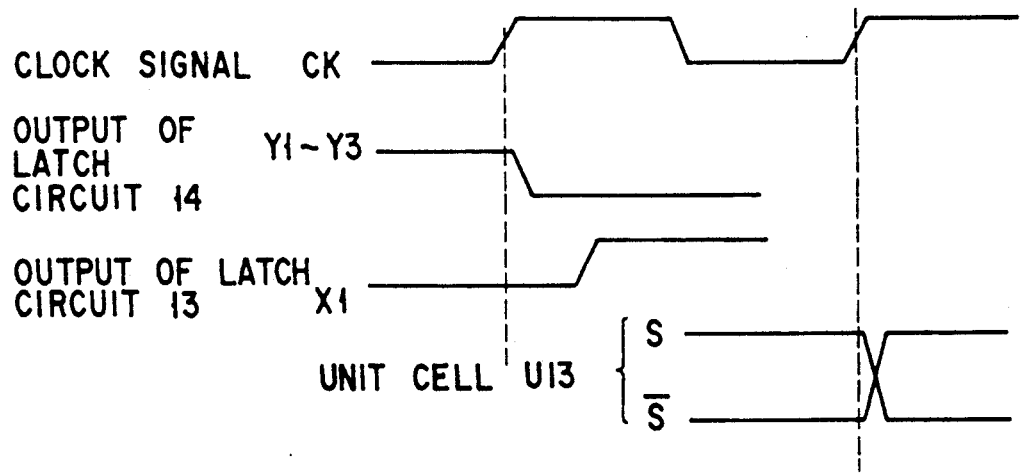
FIG. 17
FIG. 18A          FIG. 18B

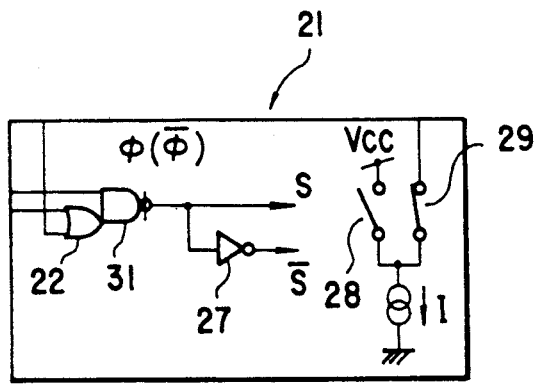
F I G. 19 A
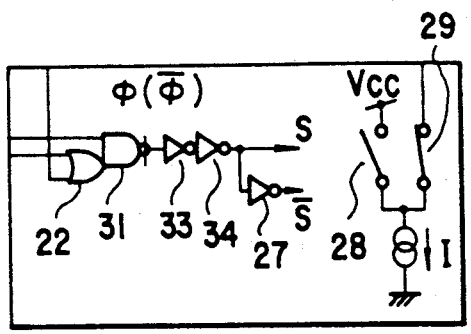
F I G. 19 B
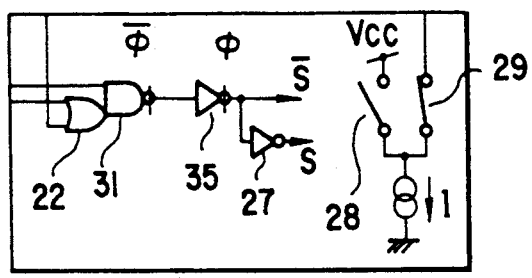
F I G. 19 C
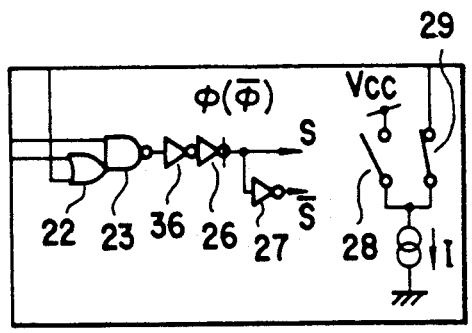
F I G. 19 D
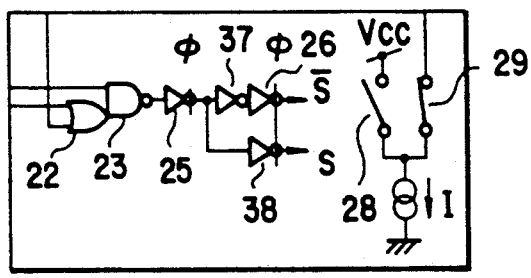
F I G. 19 E

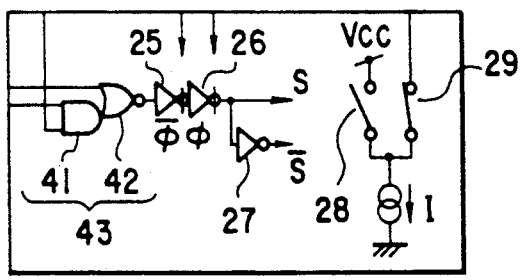
F I G. 19F
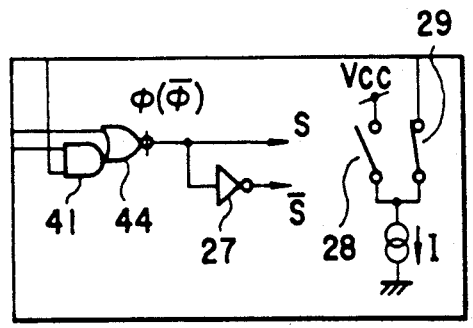
F I G. 19G
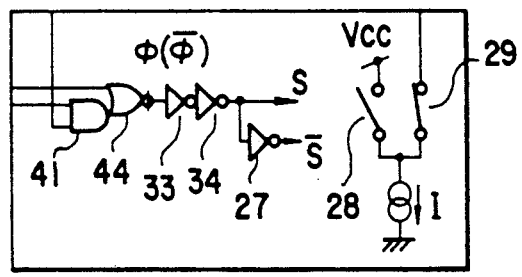
F I G. 19H
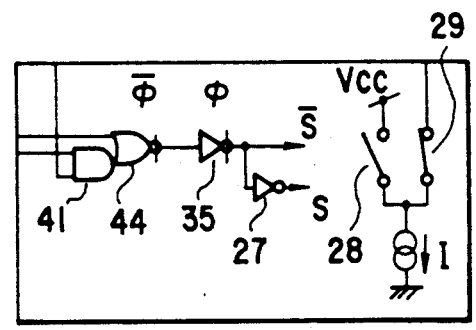
F I G. 19I
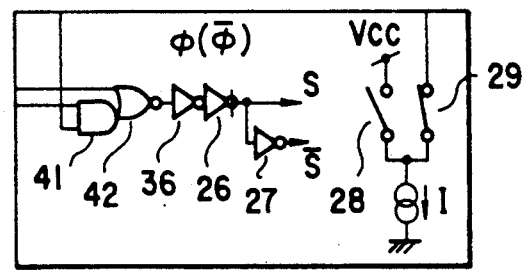
F I G. 19J
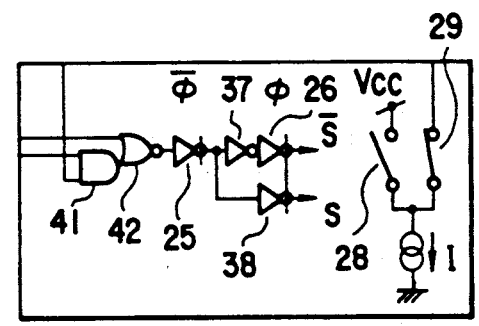
F I G. 19K

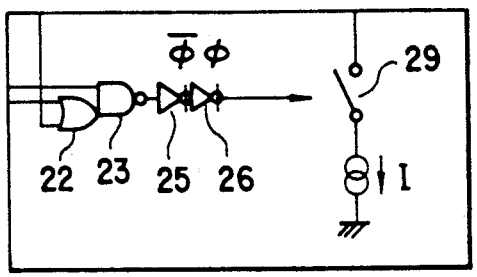
F I G. 19 L
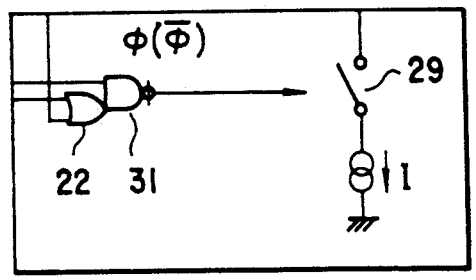
F I G. 19 M
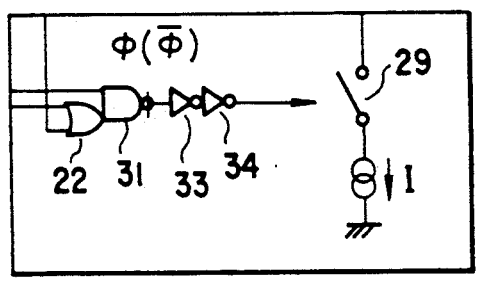
F I G. 19 N
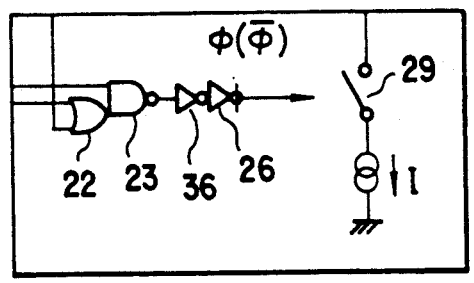
F I G. 19 O

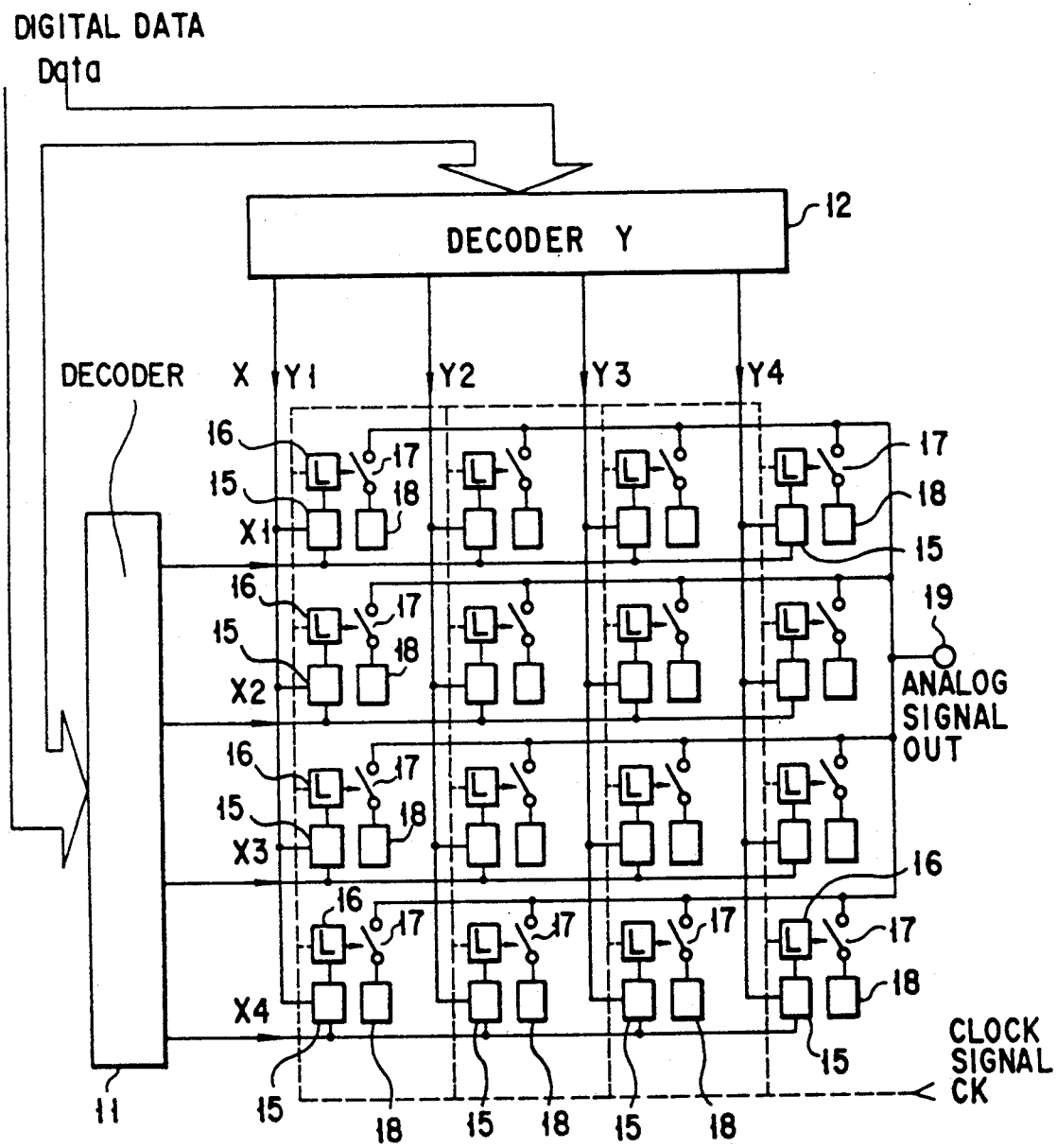
F I G. 20

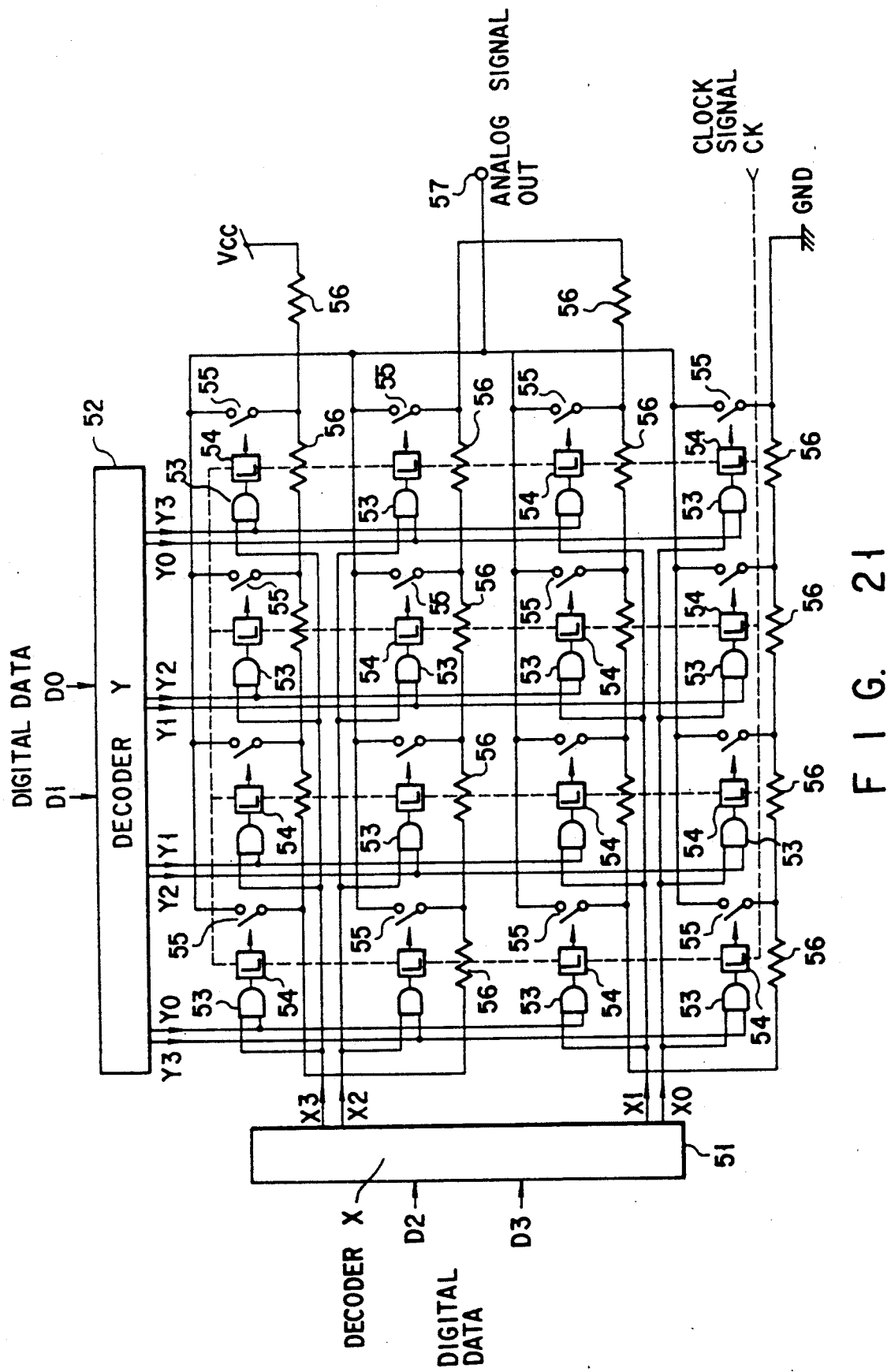
F I G. 21

| D1 | D0 | X0 | X1 | X2 | X3 |
|----|----|----|----|----|----|
| D3 | D2 | Y0 | Y1 | Y2 | Y3 |
| 0 | 0 | 1 | 0 | 0 | 0 |
| 0 | 1 | 0 | 1 | 0 | 0 |
| 1 | 0 | 0 | 0 | 1 | 0 |
| 1 | 1 | 0 | 0 | 0 | 1 |

FIG. 22

DIGITAL TO ANALOG CONVERTER

BACKGROUND OF THE INVENTION

1. Field of the Invention

The present invention relates to a digital to analog (D/A) converter which is required to stabilize the operation and enhance the operation speed.

2. Description of the Related Art

FIG. 1 is a circuit diagram showing an example of a conventional D/A converter. FIG. 1 schematically shows a circuit construction of an 8-bit D/A converter disclosed in "An 80-MHz 8-bit CMOS D/A Converter" (IEEE JOURNAL OF SOLID-STATE CIRCUITS, VOL. SC-21. NO. 6, DEC. 1986,) FIG. 2 is a flowchart showing the operation of the D/A converter of FIG. 1 from the step of inputting digital data Data to the step of outputting an analog signal OUT. Digital data Data is input to a decoder X 61 on the MSB (Most Significant Bit) side and a decoder Y 62 on the LSB (Least Significant Bit) side. Outputs PX1 to PX4 of the decoder 61 and outputs PY1 to PY4 of the decoder 62 are respectively input to latch circuits 63 and 64. The latch circuits 63 and 64 respectively supply in synchronism with a clock signal CK the latch outputs X1 to X4 and Y1 to Y4 to switch control circuits 65 arranged in a matrix form. The switch control circuit 65, switch 66 and analog signal source 67 constitute a unit cell. With this construction, one of the unit cells is defined corresponding to the input digital data. The switches 66 are respectively controlled by the corresponding switch control circuits 65. According to ON/OFF of the switches 66, the analog signal sources 67 each constructed by a resistor or current source having a predetermined analog value are selectively connected to an output terminal 68 or disconnected therefrom. By effecting a sequence of the above operations, an analog signal OUT corresponding to the digital data Data is derived from the output terminal 68.

FIG. 3 is a timing chart showing the operation of the circuit shown in FIG. 1. In FIG. 3, T11 denotes a time delay from the time the digital data Data is supplied to the decoders 61 and 62 until the outputs PX1 to PX4 and PY1 to PY4 are output; T12, a time delay from the time the outputs X1 to X4 and Y1 to Y4 are supplied from the latch circuits 63 and 64 to the respective switch control circuits 65 until the control signals are output from the switch control circuits 65 to the respective switches 66; and T13, a time delay taken until a preset number of analog sources 67 are connected to the output terminal 68 via the corresponding switches 66. An analog signal reaches a corresponding level. The switches 66 are switched when the delay time T12 has elapsed after the clock signal CK raised. The process time T12+T13 determines the time period TS of the clock signal CK and therefore the delay time T12 limits the enhancement of D/A conversion speed.

FIG. 4 is a circuit diagram of a concrete construction of a 4-bit D/A converter obtained as the simplified construction of the 8-bit D/A converter of FIG. 1. In FIG. 4, the relation between digital data D0, D1 and D2, D3 respectively input to the decoders 62 and 61 and outputs PX1 to PX3 and PY1 to PY3 respectvely output from the decoders 61 and 62 can be attained, for example, as shown in the truth table of FIG. 5. Latch circuits 63 and 64 are constructed by, for example, 2-stage clocked inverters. They respectively output latched outputs X1 to X3 and Y1 to Y3 in response to the rise of the clock signal CK. In FIG. 4, fifteen unit cells 71 which have the same construction as the unit cell of FIG. 1 and arranged in the matrix form are provided.

FIG. 6 is a circuit diagram showing an embodiment of the unit cell shown in FIG. 4. In order to attain a linear increasing characteristic of the output, a NAND.OR circuit 72 shown in FIG. 6 is used in each of the unit cells 71. On/off operation of the switches 73 and 74 are controlled by selectively supplying the outputs X1 to X3 and Y1 to Y3 of the latch circuits 63 and 64 to the predetermined input terminals of the NAND.OR circuit 72. The switch 73 is turned on (the switch 74 is turned off) when an output signal S of the NAND.OR circuit 72 is "1" and a signal $\bar{S}$ (which is an inverted form of signal S) which is derived via an inverter 75 is "0". An analog current source I is therefore connected to the output terminal 68. Further, when output S is "0" ($\bar{S}$ is "1"), the switch 73 is turned off (the switch 74 is turned on). Therefore the unit cell 71 is not connected to the output terminal 68.

FIG. 7 is a timing chart showing an example of the operation of the D/A converter of FIG. 4. Assume now that digital data Data is changed from the status "1100" to the status "1011" in the circuit of FIG. 4. In FIG. 7, a timing chart in a case where the digital data Data is changed from "1100" to "1011" is shown. FIGS. 8A and 8B are status diagrams showing the switch image of the matrix of the unit cell 71 obtained in such case. At the time of the status "1100", i.e., in the time period T21, the switch image of the matrix shown in FIG. 8A is obtained. That is, three out of the fifteen switches 74 are turned on and twelve switches 73 are turned on in the unit cell 71. Then, at the time of the status "1011", i.e., in the time period T22, the switch image of the matrix shown in FIG. 8B is obtained. That is, four out of the fifteen switches 74 are turned on and eleven switches 73 are turned on in the unit cell 71.

As described above, the digital data Data is changed from the status "1100" to the status "1011" at the time of rise of the clock signal CK of FIG. 7. This means that the outputs Y1 to Y3 of the latch circuit 64 are changed from "1" to "0" and the output X1 of the latch circuit 63 is changed from "0" to "1". At the time of level change, a phase difference may be caused between the outputs Y1 to Y3 of the latch circuit 64 and the output X1 of the latch circuit 63 in the time period T23 as shown in the timing chart of FIG. 9. The phase difference is caused by a difference in the wiring capacitance for the outputs Y1 to Y3 and the output X1 or a difference in the number of gates of the actually connected unit cells 71. As a result, the outputs Y1 to Y3 may sometimes be changed from "1" to "0" earlier than the output X1 is changed from "0" to "1". At this time, the switch image of the matrix shown in FIG. 10 is obtained and the switches 74 of all of the unit cells are turned on. As a result, the analog signal OUT of the output terminal 68 varies with time t as shown in FIG. 11 when the digital data Data is changed from "1100" to "1011". That is, the number of analog current sources I to be connected to the output terminal 68 is temporarily set to 15×I after it has been set to 12×I and before it is set to 11×I. A so-called glitch occurs. For this reason, a long time delay occurs before the number of analog current sources I to be connected to the output terminal 68 reaches a desired number 11×I and noises will occur in this period of time. The same drawback may occur when the digital data Data is changed in a different case.

SUMMARY OF THE INVENTION

The present invention has been made in view of the above drawback, and an object of the present invention is to provide a digital to analog converter capable of increasing the D/A conversion speed and preventing unnecessary switches from being switched and suppressing occurrence of noises when the digital data is changed.

According to an aspect of the present invention, there is provided a digital to analog converter comprising: a decoder arranged in X and Y directions, for receiving input digital data and outputting decoded outputs corresponding to the input digital data; and a plurality of unit cells arranged in a matrix form, for outputting analog data according to the decoded outputs of the decoder, and each of which includes a latch circuit for latching predetermined outputs of the decoded outputs.

According to another aspect of the present invention, there is provided a digital to analog converter comprising: an X and Y-directional decoder for receiving input digital data and outputting decoded outputs corresponding to the input digital data; and a plurality of unit cells arranged in a matrix form, for outputting analog data according to the decoded outputs, each of the plurality of unit cells including: a signal source for providing a preset analog value; a switching means for connecting/disconnecting the signal source to/from an analog output terminal; a switch control circuit for generating a control signal to control the switching means based on predetermined outputs of the decoded outputs from the X and Y-directional decoder; and a latch circuit for latching the control signal and outputting latched control signal to control an operation of the switching means.

According to still another aspect of the present invention, there is provided a digital to analog converter comprising: an X and Y-directional decoder for receiving input digital data and outputting decoded outputs corresponding to the input digital data; a first latch circuit for latching the decoded outputs and outputting latched decoded outputs; and a plurality of unit cells arranged in a matrix form, for outputting analog data according to the latched decoded outputs, each of the plurality of unit cells including: a signal source for providing a preset analog value; a switching means for connecting disconnecting the signal source to/from an analog output terminal; a switch control circuit for generating a control signal to control the switching means based on predetermined outputs of the latched decoded outputs from the first latch circuit; and a second latch circuit for latching the control signal and outputting latched control signal to control an operation of the switching means.

In the present invention, the latch circuits are provided for the respective switch controlling circuits for controlling the switching means to shorten the period of the clock signal for defining the D/A conversion speed. Further, occurrence of switching noises such as glitch can be prevented on the output terminal side by the presence of the latch circuits.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 12 is a circuit diagram showing the construction of a first embodiment of a D/A converter according to the present invention;

FIG. 15 is a circuit diagram showing the concrete construction of the present invention obtained as the simplified D/A converter of FIG. 12;

FIG. 16 is a circuit diagram showing an example of the construction of a unit cell 21 shown in FIG. 15;

FIG. 17 is a timing chart illustrating the operation of the D/A converter of FIG. 15;

FIGS. 18A and 18B are status diagrams showing switch images in the matrix of unit cells 21 of FIG. 15;

FIG. 20 is a circuit diagram showing the construction of a second embodiment of a D/A converter according to the present invention;

FIG. 21 is a circuit diagram showing the construction of a third embodiment of a D/A converter according to the present invention; and FIG. 22 is a diagram showing truth values of signals used in part of the operation of the circuit of FIG. 21.

DETAILED DESCRIPTION OF THE PREFERRED EMBODIMENTS

Figure 1:
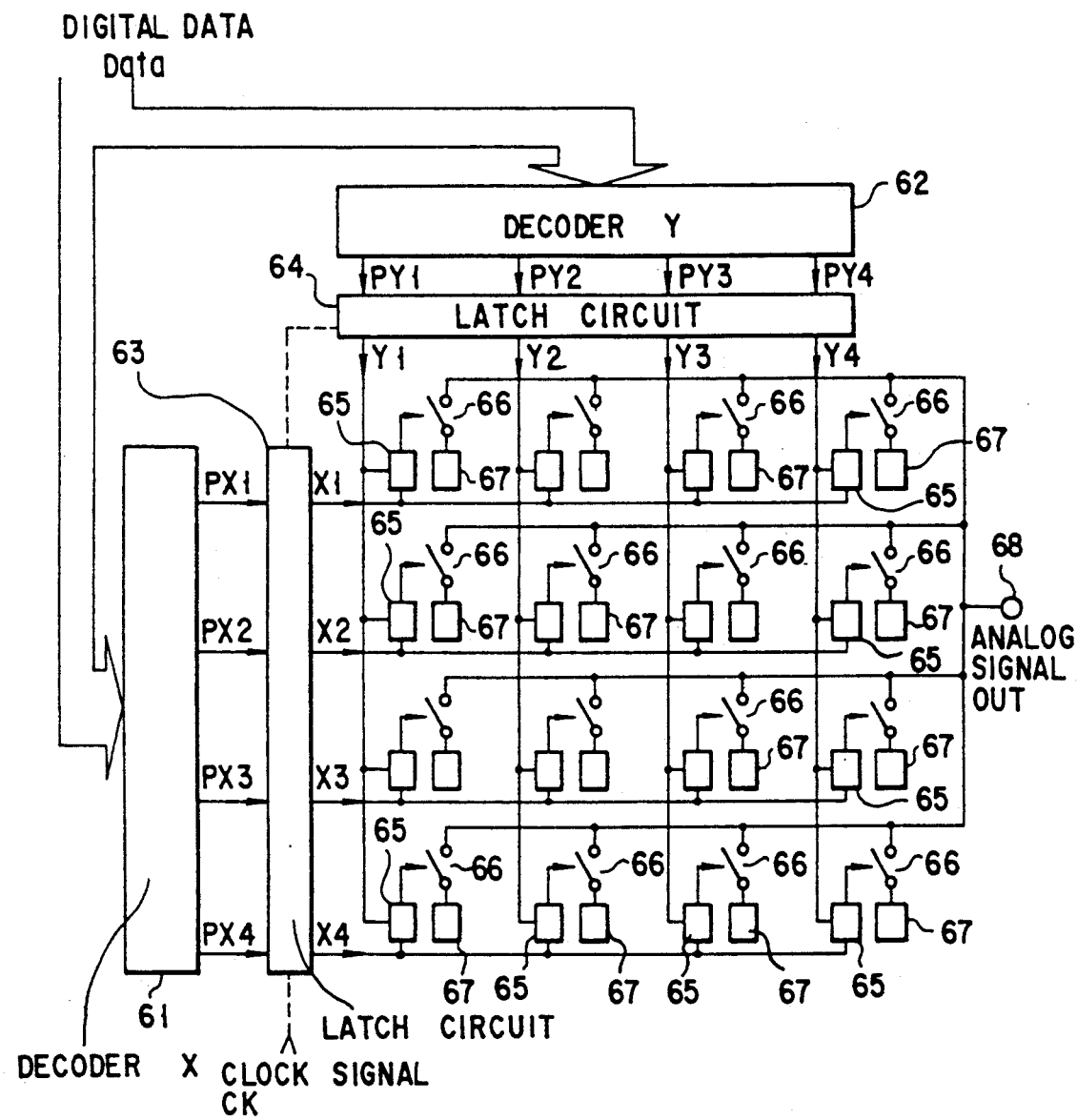
FIG. 1 is a circuit diagram showing the construction of a conventional D/A converter.
Figure 2:
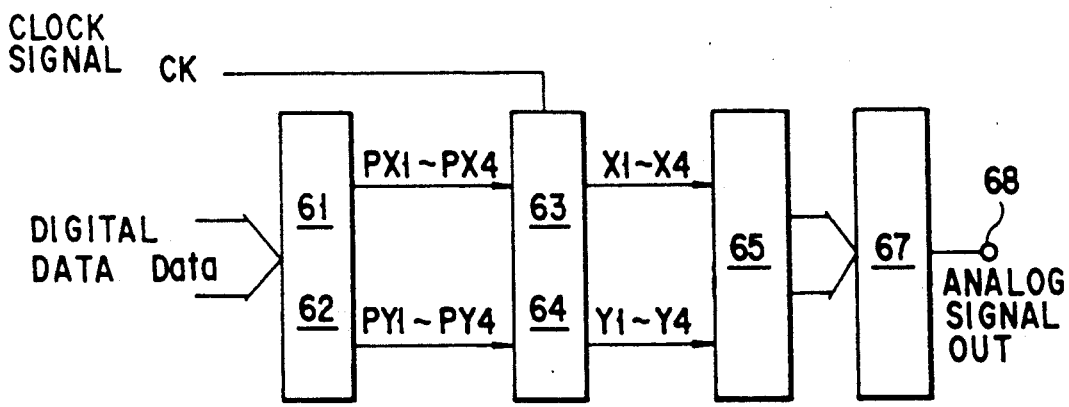
FIG. 2 is a flowchart showing the operation of the D/A converter of FIG. 1 from the step of inputting digital data to the step of outputting an analog signal.
Figure 3:
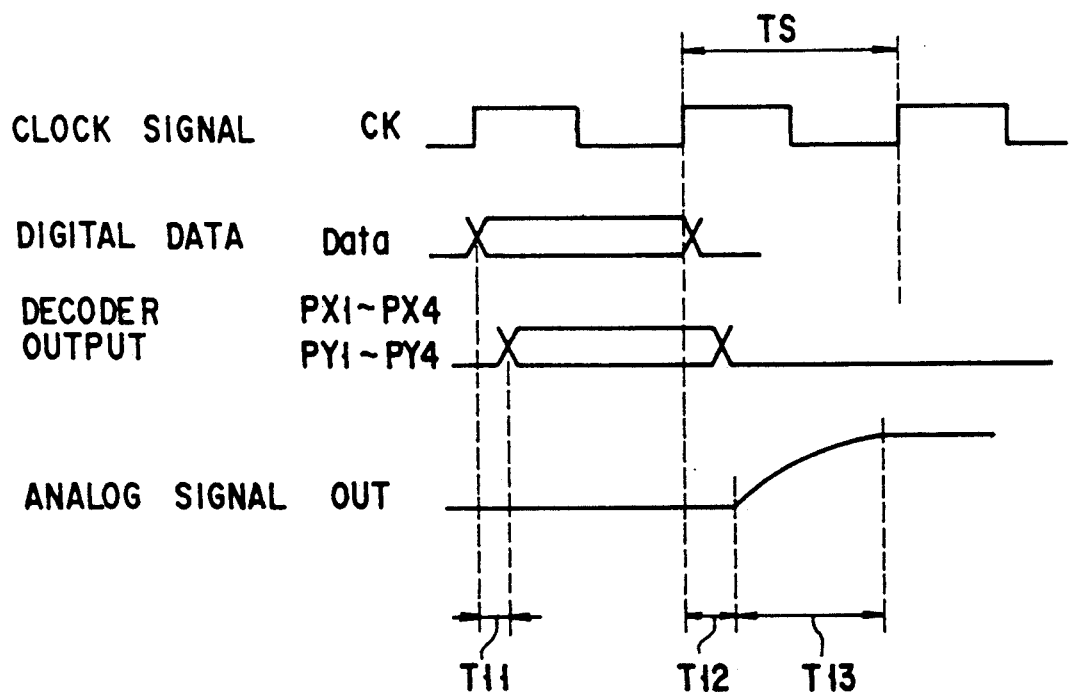
FIG. 3 is a timing chart illustrating the operation of the circuit of FIG. 1.
Figure 4:
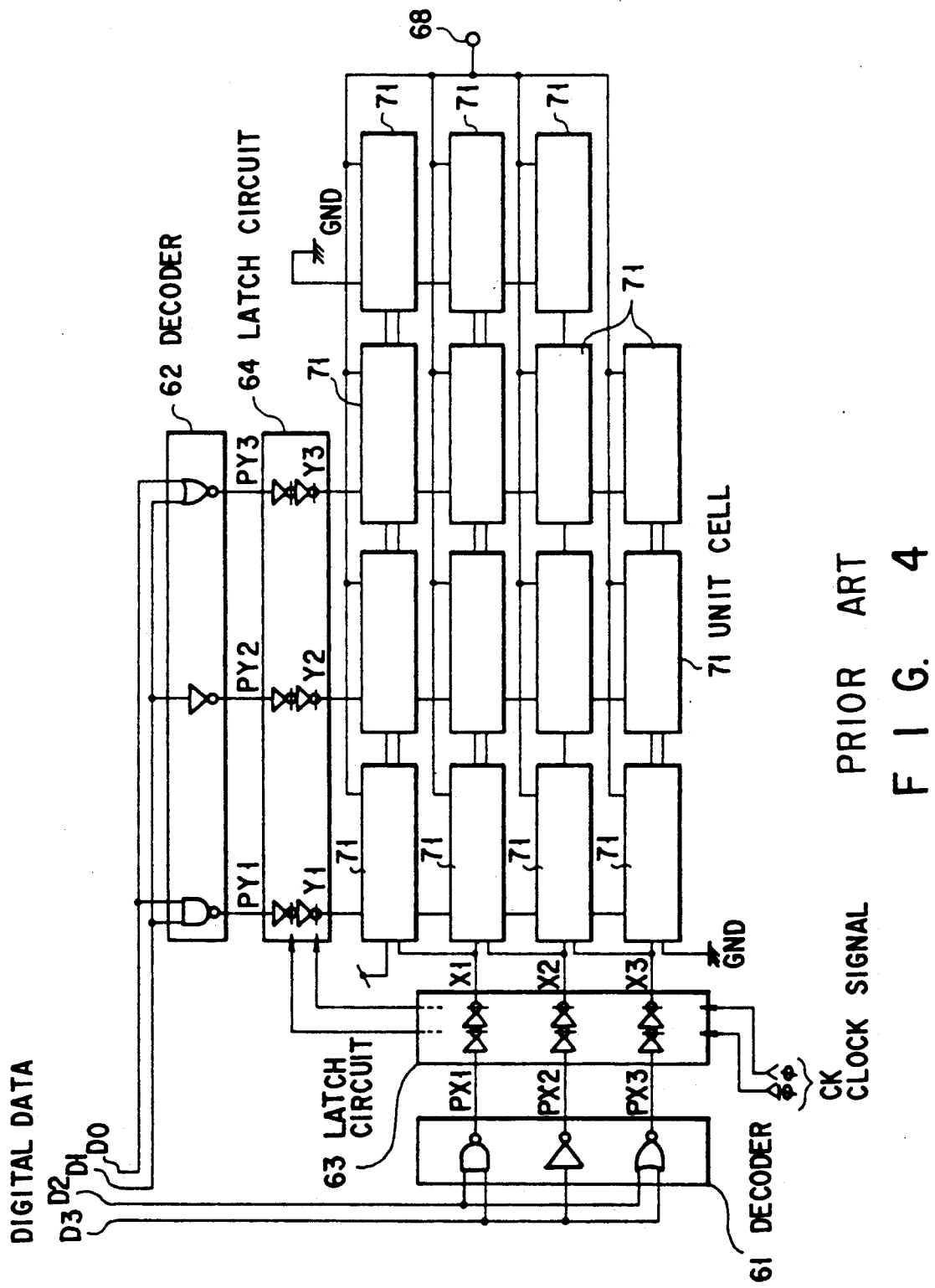
FIG. 4 is a circuit diagram showing a concrete construction of a D/A converter obtained as the simplified construction of FIG. 1.

There will now be described embodiments of a D/A converter of the present invention with reference to the accompanying drawings.

FIG. 12 is a circuit diagram showing the construction of a first embodiment of a D/A converter according to the present invention. An 4-bit D/A converter is used in the first embodiment. A decoder 11 on the MSB side and a decoder 12 on the LSB side, both are supplied with 4-bit digital data, are arranged to intersect with one another. The decoders 11 and 12 respectively generate decoded outputs PX1 to PX4 and PY1 to PY4. Latch circuits 13 and 14 are respectively connected to the decoders 11 and 12 and latch the decode outputs PX1 to PX4 and PY1 to PY4, respectively. Unit cells are arranged in a matrix form, corresponding to the latched outputs X1 to X4 of the latch circuit 13 and the latched outputs Y1 to Y4 of the latch circuit 14. Each of the unit cells includes a switch control circuit 15, a latch circuit 16, a switch circuit 17 and an analog signal source 18. The switch control circuit 15 controls the ON-OFF state of the switch circuit 17 according to the latched outputs X1 to X4 and Y1 to Y4 of the latch circuits 13 and 14. The analog signal source 18 is constructed by a resistor having a predetermined analog resistance value or a current source providing a predetermined analog current value and supplies an output analog value corresponding to the input digital data. The latch circuit 16 latches the output of the switch control circuit 15 and acts to eliminate a glitch due to variation in the phases of the outputs X1 to X4 and Y1 to Y4 caused by a difference in the number of gates of the unit cells. The latch circuits 13 and 14 and the latch circuit 16 of each unit cell are connected to the same clock signal source (not shown), and are operated at the same timing determined by the frequency of the clock signal CK. The output terminal of the respective switch circuit 17 is connected to the output terminal 19 from which an analog signal OUT is output.

Figure 13:
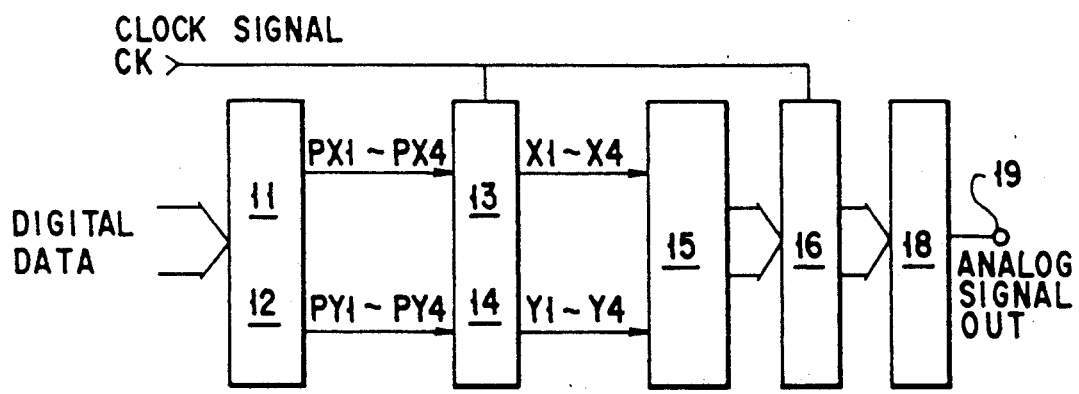
FIG. 13 is a flow chart showing the operation of the D/A converter of FIG. 12 from the step of inputting digital data to the step of outputting an analog signal.
Figure 14:
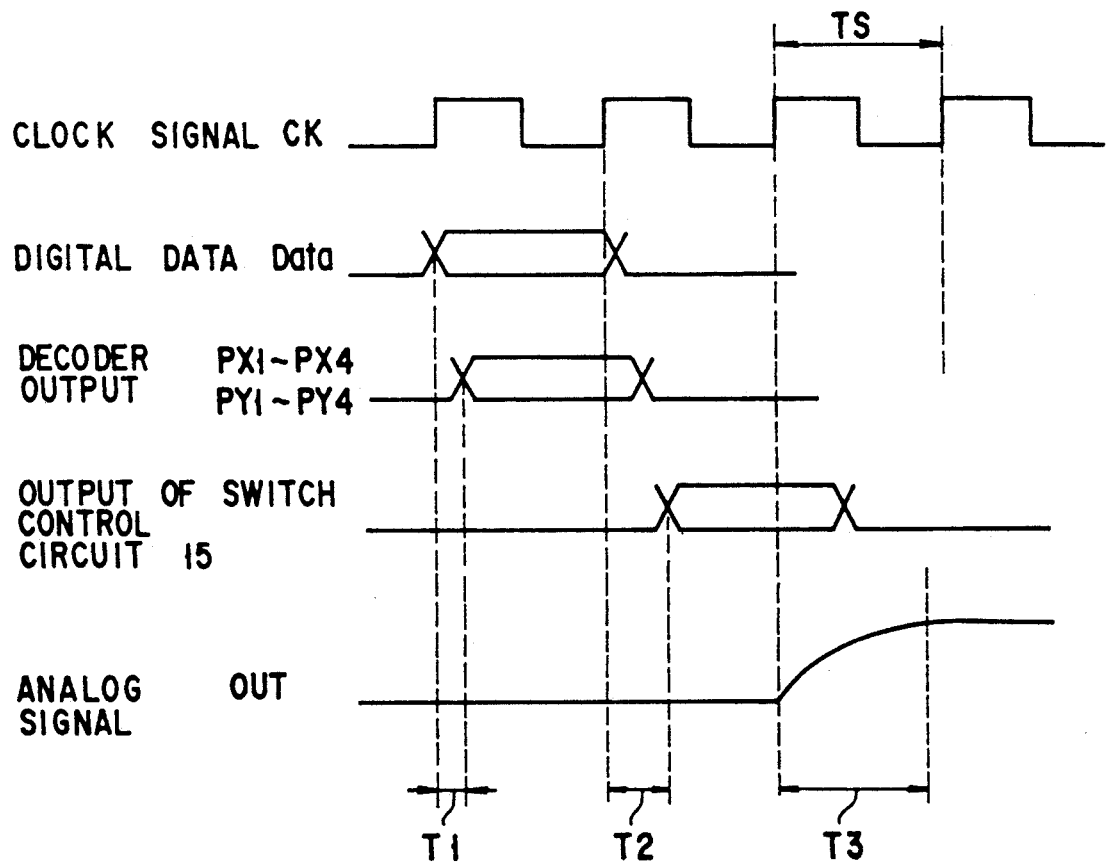
FIG. 14 is a timing chart illustrating the operation of the D/A converter of FIG. 12.

The operation of the first embodiment of FIG. 12 is then explained with reference to FIGS. 12, 13 and 14. FIG. 13 is a flowchart showing the process from the step of inputting digital data Data to the step of outputting an analog signal in the operation of the circuit of FIG. 12. FIG. 14 is a timing chart showing the operation of the circuit of FIG. 12. Digital data Data is input to the decoders 11 and 12 and outputs PX1 to PX4 and PY1 to PY4 thereof are respectively supplied to the latch circuits 13 and 14. The latch circuits 13 and 14 respectively supply the latched outputs X1 to X4 and Y1 to Y4 to the switch control circuit 15 in synchronism with the clock signal CK. An output of each of the switch control circuits 15 is supplied to the latch circuit 16 provided in the same unit cell. The latch circuit 16 controls the ON-OFF state of the switch 17 in synchronism with rise of the clock signal CK. An analog signal is output from the output terminal 19 according to that a predetermined number of analog signal sources 18 corresponding to the input digital data Data are connected to the output terminal 19 via the respective switches 17.

In FIG. 14, T1 denotes a time delay from the time the digital data Data is supplied to the decoders 11 and 12 until the outputs PX1 to PX4 and PY1 to PY4 are output; T2, a time delay from the time the outputs X1 to X4 and Y1 to Y4 are supplied from the latch circuits 13 and 14 to the respective switch control circuits 15 until the control signals are output from the switch control circuits 15 to the respective latch circuits 16; and T3, a time delay taken until the switches 17 are operated by the control signals output from the respective latch circuits 16 to connect a preset number of the analog signal sources 18 to the output terminal 19. An analog signal then reaches a corresponding level. By referring to the waveform of a signal on the output terminal 19, it is noted that the switching operation of the switch circuit 17 is started at the same time as the rise of the clock signal CK and thus a time period during when an analog signal reaches a desired level can be shortened. As a result, the processing time by which the time period TS of the clock signal CK is defined is only the time period T3 so that the D/A conversion speed can be increased. This is because the number of latch stages increases and the period TS of the clock signal CK can be reduced in comparison with those used in the conventional case so that the data process is permitted to be effected at a high clock frequency. Further, no glitch will occur since the operation is not influenced by variation in the phase of the latched outputs X1 to X4 and Y1 to Y4.

Figures 5, 6:
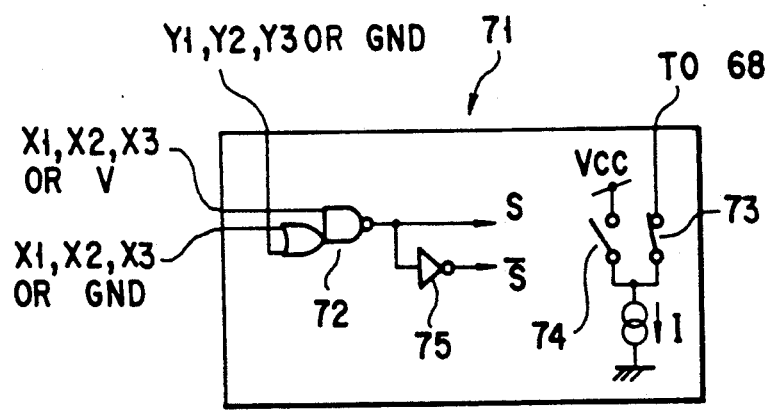
FIG. 5 is a diagram showing truth values of signals used in part of the operation of the circuit of FIG. 4.
FIG. 6 is a circuit diagram showing an embodiment of the unit cell 71 shown in FIG. 4.
Figure 7:
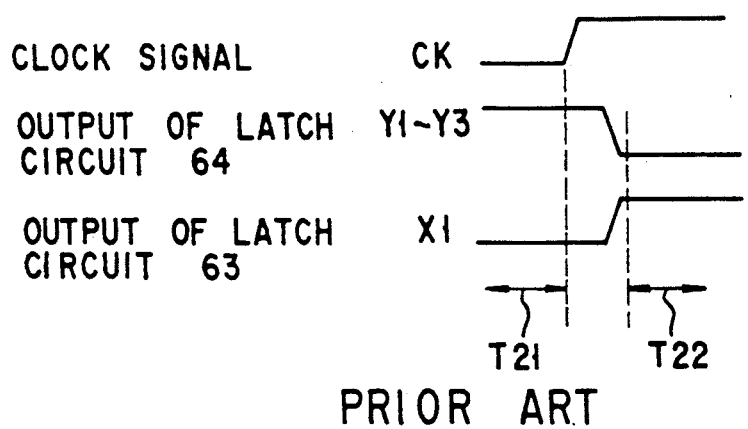
FIG. 7 is a timing chart showing the operation of the circuit of FIG. 4.
Figure 8A:
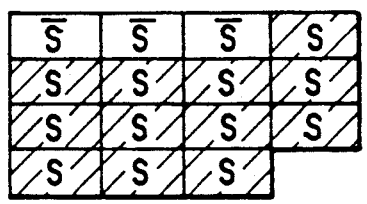
FIGS. 8A and 8B are status diagrams showing switch images in the matrix of unit cells 71 of FIG. 4.
Figure 8B:
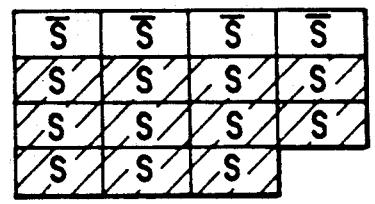
Figure 9:
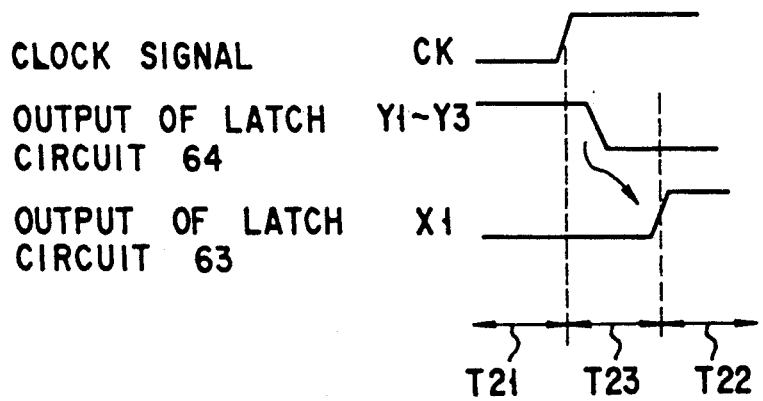
FIG. 9 is a timing chart illustrating the drawback occurred by the operation of the circuit shown in FIG. 4.
Figure 10:
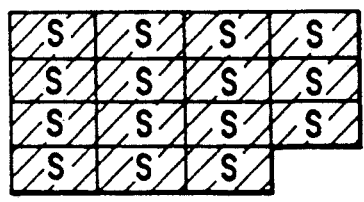
FIG. 10 is a status diagram showing a switch image in the matrix of unit cells of FIG. 4 for explaining the drawback of FIG. 9.
Figure 11:
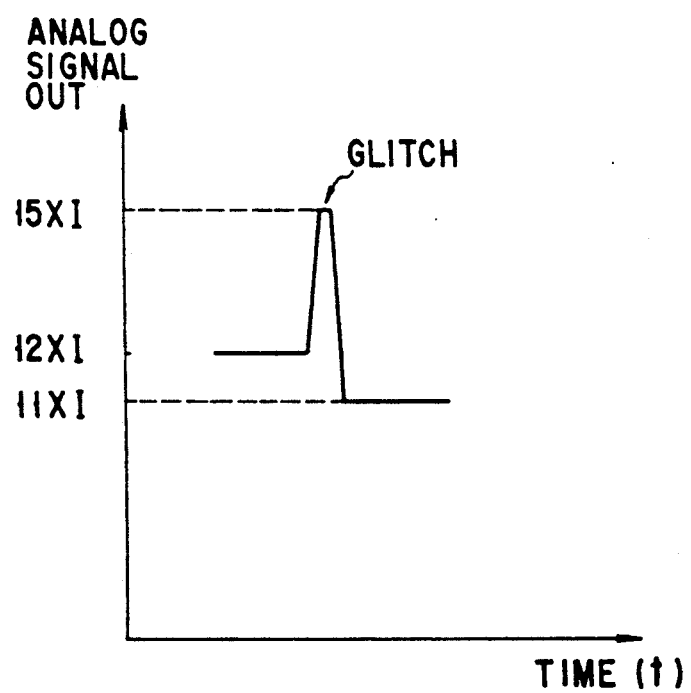
FIG. 11 is a characteristic diagram showing variation in the analog signal output causing a glitch in the operation of the circuit of FIG. 4.

FIG. 15 is a circuit diagram showing the concrete construction of a 4-bit D/A converter obtained by simplifying the 8-bit D/A converter of the above embodiment. In FIG. 15, portions which are the same as those of FIG. 12 are denoted by the same reference numerals. The decoders 11 and 12 in FIG. 15 is so constructed, for example, that the relation between input digital data D2, D3 and D0, D1 respectively input to the decoders 11 and 12 and the decoded outputs PX1 to PX3 and PY1 to PY3 respectively output from the decoders 11 and 12 will be attained as shown in the truth table of FIG. 5. The decoder 11 includes a NAND gate 11-1 receiving the digital data D2 and D3, an inverter 11-2 receiving the digital data D2, and a NOR gate 11-3 receiving the digital data D2 and D3. The decoder 12 also includes a NAND gate 12-1 receiving the digital data D0 and D1, an inverter 12-2 receiving the digital data D1, and a NOR gate 12-3 receiving the digital data D0 and D1. The latch circuits 13 and 14 are respectively constructed by, for example, 2-stage clocked inverters 13-1 to 13-3 and 2-stage clocked inverters 14-1 to 14-3, which respectively supply the outputs X1 to X3 and the outputs Y1 to Y3 in response to rise of the clock signal CK. Unit cells U1 to U15 each include the switch control circuit 15, the latch circuit 16, the switch 17 and the analog signal source 18 shown in FIG. 12. Fifteen unit cells 21 are arranged in the matrix form.

FIG. 16 is a circuit diagram showing an example of the construction of the unit cell 21. Various signals are input to predetermined input terminals of a NAND.OR circuit 24 constructed by an OR circuit 22 and a NAND circuit 23. One of the input terminals of the OR circuit 22 is supplied with one of the output signals X1, X2, X3 of the latch circuit 13 or a ground voltage GND. The other input terminal of the OR circuit 22 is supplied with one of the output signals Y1, Y2, Y3 of the latch circuit 14 or the ground voltage GND. One of the input terminals of the NAND circuit 23 is supplied with one of the output signals X1, X2, X3 of the latch circuit 13 or a power source voltage Vcc. The other input terminal of the NAND circuit 23 is connected to the output terminal of the OR circuit 22. The output terminal of the NAND.OR circuit 24 is connected to a series circuit of two clocked inverters 25 and 26. The inverters 26 and 25 are controlled by signals $\phi$ and $\bar{\phi}$ ($\bar{\phi}$ is an inverted form of $\phi$) corresponding to the clock signal CK. The clocked inverter 26 outputs a signal $\bar{S}$ which is supplied to a switch 28. A signal S inverted by an inverter 27 is then supplied to a switch 29. The switch 28 is connected between the power source Vcc and the analog current source I. The switch 29 is connected between a terminal connected to the output terminal 19 and the analog current source I. The switches 28 and 29 are controlled by inputting the latched signals X1 to X3 and Y1 to Y3 to the predetermined input terminals of the NAND.OR circuit 24. When the signal $\bar{S}$ ($\bar{S}$ is an inverted form of the output signal S) is "0" and the signal S is "1", the switch 29 is turned on (the switch 28 is turned off). The analog current source I of the unit cell is thus connected to the output terminal 19. On the other hand, when the signal S is "0" ($\bar{S}$ is "1"), the switch 29 is turned off (the switch 28 is turned on) and the unit cell 21 is not connected to the output terminal 19.

Assume now that digital data Data is changed from the status "1100" to the status "1011" in the circuit of FIG. 15. FIG. 17 is a timing chart showing variation in the signals caused when the digital data Data is changed from the status "1100" to the status "1011". FIGS. 18A and 18B are status diagrams showing switch images of the matrix of the unit cell 21 when the digital data Data is changed as above. When the digital data Data is changed from the status "1100" to the status "1011" as above, the outputs Y1 to Y3 of the latch circuit 14 are changed from "1" to "0" and the output X1 of the latch circuit 13 is changed from "0" to "1" in synchronous with the first rise timing of the clock signal CK, as shown in FIG. 17. In the present invention, even when a phase difference occurs between the outputs Y1 to Y3 and the output X1, the signals Y1 to Y3 of "0" and X1 of "1" obtained after the outputs Y1 to Y3 and X1 are completely changed as shown in FIG. 18A and 18B are latched by the clocked inverters 25 and 26 in FIG. 16. The switches 28 and 29 of the unit cell U13 are controlled by the signals S and $\bar{S}$ at the time of second rise of the clock signal CK, as shown in FIG. 17, so that a desired analog signal is permitted to be output from the output terminal 19.

Thus, when the digital data Data is changed from the status "1100" to the status "1011", for example, the number of analog current sources I connected to the output terminal is simply changed from 12×I to 11×I. As a result, the switch status will be smoothly changed from the status of FIG. 18A to the status of FIG. 18B. Therefore, unlike the conventional case, no noise will occur before the output is stabilized and an analog output can be obtained at a higher speed.

Figure 19P:
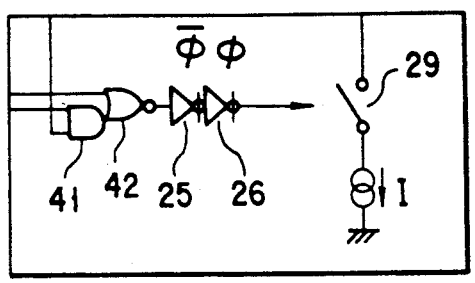
FIGS. 19A to 19B are circuit diagrams showing modifications of the unit cell shown in FIG. 15.
Figure 19Q:
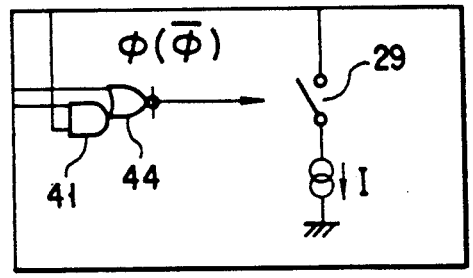
Figure 19R:
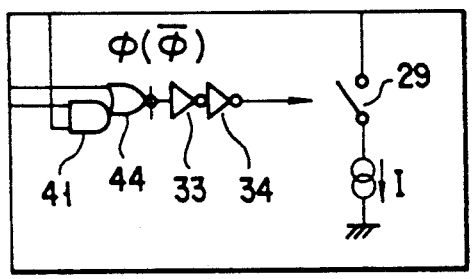
Figure 19S:
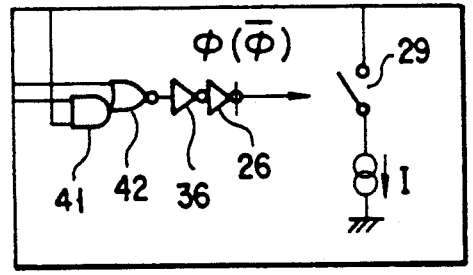

FIGS. 19A to 19S are circuit diagrams showing the construction of modifications of the unit cell 21 shown in FIG. 16. In each of the unit cells shown in FIGS. 19A to 19E, the basic logic circuit is constructed by a NAND.OR circuit which is the same as that of the unit cell shown in FIG. 16. However, the way of supplying the clock signal is different from each other. FIG. 19A shows a unit cell 21 which has a construction obtained by replacing the NAND circuit 23 of FIG. 16 by a clocked NAND circuit 31 and is supplied with a clock signal $\phi$ or $\bar{\phi}$. An output of the NAND circuit is supplied as a signal S and supplied after being inverted into a signal $\bar{S}$ via an inverter 27 and the signals are used to control switches 28 and 29. FIG. 19B shows a unit cell 21 in which an output of the clocked NAND circuit 31 of FIG. 19A is supplied via a series circuit of inverters 33 and 34 and output as a signal $\bar{S}$ and the output of the series circuit of the inverters is also output after being inverted into a signal S via the inverter 27, and the signals are used to control switches 28 and 29. FIG. 19C shows a unit cell 21 in which an output of the clocked NAND circuit 31 of FIG. 19A which is supplied with the clock signal $\bar{\phi}$ is input to a clocked inverter 35, a signal S is output from the clocked inverter 35 at a timing of the clock signal $\phi$ supplied to the clocked inverter 35 and is also output after being inverted into a signal $\bar{S}$ via the inverter 27, and the signals are used to control switches 28 and 29. FIG. 19D shows a unit cell 21 which has a construction obtained by replacing the clocked inverter 25 of FIG. 16 by an inverter 36, a signal $\bar{S}$ is output from the clocked inverter 26 which is supplied with a clock signal $\phi$ or $\bar{\phi}$ and the output of the clocked inverter 26 is also output after being inverted into a signal S via the inverter 27. The signals are used to control switches 28 and 29. FIG. 19E shows a unit cell 21 in which an inverter 37 is connected between the series-connected clocked inverters 25 and 26 shown in FIG. 16. Further, a clocked inverter 38 is provided instead of the inverter 27 and the input terminal thereof is connected to the output terminal of the inverter 25. The clocked inverter 38 is supplied with a signal $\phi$ so as to be controlled at the same time as the clocked inverter 26. An output of the clocked inverter 26 serves as a signal S and an output of the clocked inverter 38 serves as a signal $\bar{S}$, and the signals are used to control switches 28 and 29.

FIGS. 19F to 19K show unit cells in which the basic logic circuit is constructed by a NOR.AND circuit 43 which is formed of an AND circuit 41 and a NOR circuit 42 instead of the NAND.OR circuit 24 which is formed of the OR circuit 22 and the NAND circuit 23. The circuit construction of FIG. 19F corresponds to that of FIG. 16, and the circuit constructions of FIGS. 19G to 19K correspond to those of FIGS. 19A to 19E.

FIGS. 19L to 19O show unit cells in which the basic logic circuit has a circuit portion formed to generate a single output signal like the NAND.OR circuit 24 of FIG. 16 and includes a single switch to be connected to the analog signal source.

FIGS. 19P to 19S show unit cells in which the basic logic circuit has a circuit portion formed to generate a single output signal like the NOR.AND circuit 43 of FIGS. 19F to 19K and includes a single switch.

FIG. 20 is a circuit diagram showing the construction of a second embodiment of the D/A converter of the present invention. The D/A converter is similar to that of FIG. 12 except that the latch circuits 13 and 14 for latching outputs PX1 to PX4 and PY1 to PY4 of the decoders 11 and 12 are omitted. Each switch control circuit 15 directly receives the decoded outputs X1 and X4 and Y1 to Y4 from the decoders 11 and 12. All of the latch circuits 16 are connected to the same clock signal source (not shown) and are supplied with the clock signal CK having the same frequency. The operation speed of the D/A converter can be increased in comparison with that of FIG. 12 by an amount caused by omission of the latch circuits 13 and 14.

FIG. 21 is a circuit diagram showing the construction of a third embodiment of the D/A converter of the present invention. The present invention is applied to an R-segment type 4-bit D/A converter. The D/A converter includes decoders 51 and 52 and is so constructed that the relation between digital data D0, D1 and D2, D3 respectively input to the decoders 52 and 51 and outputs X0 to X3 and Y0 to Y3 respectively output from the decoders 51 and 52 can be attained as shown in the truth table of FIG. 22 The outputs X0 to X3 of the decoder 51 and the outputs Y1 to Y3 of the decoder 52 are supplied to the input terminals of corresponding AND circuits 53 arranged in the matrix form. Latch circuits 54 are connected to the output terminals of the respective AND circuits 53 and connected to the same clock signal source (not shown). Outputs of the AND circuits 53 are latched by the corresponding latch circuits 54 in synchronism with the clock signal CK. Switches 55 are controlled by the output signals of the respective latch circuits 54. When the switch 55 is set into the ON or OFF-state, a corresponding one of resistors 56 having a predetermined resistance value is connected to an output terminal 57 to provide a desired analog value.

As described above, according to the present invention, use of the latch circuits in the matrix makes it possible to attain a desired analog value at the same time as the rise of the clock signal and suppress variation in the analog value on the output terminal only within the desired variation range when the digital signal is changed, thereby preventing occurrence of switch noises such as a glitch. Thus, a D/A converter whose D/A conversion operation is stabilized and whose operation speed is improved can be obtained.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A digital to analog converter comprising:
a decoder arranged in X and Y directions, for receiving input digital data and outputting decoded outputs corresponding to said input digital data; and
a plurality of unit cells arranged in a matrix form, for outputting analog data according to said decode outputs of said decoder, and each of which includes a latch circuit for latching predetermined outputs of said decoded outputs.

2. A digital to analog converter according to claim 1, wherein all of latch circuits are connected to the same synchronizing signal source to be operated at the same timing.

3. A digital to analog converter comprising:
an X and Y-directional decoder for receiving input digital data and outputting decoded outputs corresponding to said input digital data; and
plurality of unit cells arranged in a matrix form, for outputting analog data according to said decoded outputs, each of said plurality of unit cells including:
a signal source for providing a preset analog value;
a switching means for connecting/disconnecting said signal source to/from an analog output terminal;
a switch control circuit for generating a control signal to control said switching means based on predetermined outputs of said decoded outputs from said X and Y-directional decoder; and
a latch circuit for latching said control signal from said switch control circuit and outputting latched control signal to control an operation of said switching means.

4. A digital to analog converter according to claim 3, wherein all of latch circuits are connected to the same synchronizing signal source to be operated at the same timing.

5. A digital to analog converter according to claim 3, wherein said signal source includes a current source providing a preset analog current value.

6. A digital to analog converter according to claim 3, wherein said signal source includes a resistor having a preset analog resistance value.

7. A digital to analog converter comprising:
an X and Y-directional decoder for receiving input digital data and outputting decoded outputs corresponding to said input digital data;
a first latch circuit for latching said decoded outputs and outputting latched decoded outputs; and
a plurality of unit cells arranged in a matrix form, for outputting analog data according to said latched decoded outputs, each of said plurality of unit cells including:
a signal source for providing a preset analog value;
a switching means for connecting/disconnecting said signal source to/from an analog output terminal;
a switch control circuit for generating a control signal to control said switching means based on predetermined outputs of said latched decoded outputs from said first latch circuit; and
a second latch circuit for latching said control signal from said switch control circuit and outputting latched control signal to control an operation of said switching means.

8. A digital to analog converter according to claim 7, wherein said first latch circuit and all of second latch circuits are connected to the same synchronizing signal source to be operated at the same timing.

9. A digital to analog converter according to claim 7, wherein said signal source includes a current source providing a preset analog current value.

10. A digital to analog converter according to claim 7, wherein said signal source includes a resistor having a preset analog resistance value.

* * * * *

UNITED STATES PATENT AND TRADEMARK OFFICE
CERTIFICATE OF CORRECTION

PATENT NO. : 5,181,034
DATED : January 19, 1993
INVENTOR(S) : Hiroshi Takakura, Akira Yamaguchi & Tetsuya Iida It is certified that error appears in the above-identified patent and that said Letters Patent is hereby corrected as shown below:

ON THE TITLE PAGE, PLEASE INSERT:
FOREIGN APPLICATION PRIORITY DATA

April 30, 1991 [JP]  Japan. . . . . . . 3-99317

Signed and Sealed this

Eighth Day of March, 1994

Attest:

BRUCE LEHMAN

*Attesting Officer*  *Commissioner of Patents and Trademarks*